(12) United States Patent
Shigemori et al.

(10) Patent No.: US 7,834,794 B2
(45) Date of Patent: Nov. 16, 2010

(54) A/D CONVERTER

(75) Inventors: Masakazu Shigemori, Osaka (JP); Koji Sushihara, Osaka (JP); Kenji Murata, Osaka (JP)

(73) Assignee: Panasonic Corporation, Osaka (JP)

( * ) Notice: Subject to any disclaimer, the term of this patent is extended or adjusted under 35 U.S.C. 154(b) by 77 days.

(21) Appl. No.: 12/439,444

(22) PCT Filed: Aug. 10, 2007

(86) PCT No.: PCT/JP2007/065698

§ 371 (c)(1),
(2), (4) Date: Feb. 27, 2009

(87) PCT Pub. No.: WO2008/026440

PCT Pub. Date: Mar. 6, 2008

(65) Prior Publication Data

US 2010/0007541 A1    Jan. 14, 2010

(30) Foreign Application Priority Data

Aug. 31, 2006    (JP)    ............... 2006-236829

(51) Int. Cl.
*H03M 1/12*    (2006.01)
(52) U.S. Cl. ...................... 341/155; 341/156
(58) Field of Classification Search ................ 341/155, 341/156, 159, 165
See application file for complete search history.

(56) References Cited

U.S. PATENT DOCUMENTS

| 4,270,118 | A |   | 5/1981  | Brokaw |             |
|-----------|---|---|---------|------------|-------------|
| 5,272,481 | A | * | 12/1993 | Sauer      | 341/165     |
| 5,327,131 | A | * | 7/1994  | Ueno et al.| 341/136     |
| 5,436,629 | A | * | 7/1995  | Mangelsdorf| 341/156     |
| 5,471,661 | A | * | 11/1995 | Atkinson   | 455/165.1   |
| 5,767,664 | A | * | 6/1998  | Price      | 323/313     |
| 5,936,566 | A | * | 8/1999  | Park       | 341/159     |
| 6,157,338 | A |   | 12/2000 | Gross, Jr. |             |

(Continued)

FOREIGN PATENT DOCUMENTS

JP    8-37461    2/1996

(Continued)

OTHER PUBLICATIONS

International Search Report issued Sep. 25, 2007 in the International (PCT) Application No. PCT/JP2007/065698.

(Continued)

*Primary Examiner*—Jean B Jeanglaude
(74) *Attorney, Agent, or Firm*—Wenderoth, Lind & Ponack, L.L.P.

(57) ABSTRACT

The conventional A/D converter has a drawback that the conversion precision is degraded when the operation periods of the constituents of the A/D converter are shortened due to the duty ratio of an external input clock because the operation periods of the constituents of the A/D converter depend on the pulse width of the external input clock. However, a highly-precise A/D conversion operation independent of the duty ratio of the external input clock can be realized by providing a circuit for detecting the operation periods of the constituents of the A/D converter, and adjusting the duty ratio of the operation clock according to the detected operation periods of the constituents of the A/D converter.

4 Claims, 7 Drawing Sheets

U.S. PATENT DOCUMENTS 6,452,529 B1 * 9/2002 Li .............................. 341/156
6,611,222 B1 * 8/2003 Murphy ...................... 341/155
6,707,413 B2   3/2004 Sushihara et al.

FOREIGN PATENT DOCUMENTS

| JP | 9-135170 | 5/1997 |
|---|---|---|
| JP | 2000-295106 | 10/2000 |
| JP | 2003-158456 | 5/2003 |

OTHER PUBLICATIONS

Written Opinion of the ISA issued Sep. 25, 2007 in the International (PCT) Application No. PCT/JP2007/065698.

* cited by examiner

A/D CONVERTER

TECHNICAL FIELD

The present invention relates to an A/D converter, and more particularly, to an A/D converter having a parallel type configuration.

BACKGROUND ART

Hereinafter, a conventional parallel type A/D converter will be described.

Figure 7:
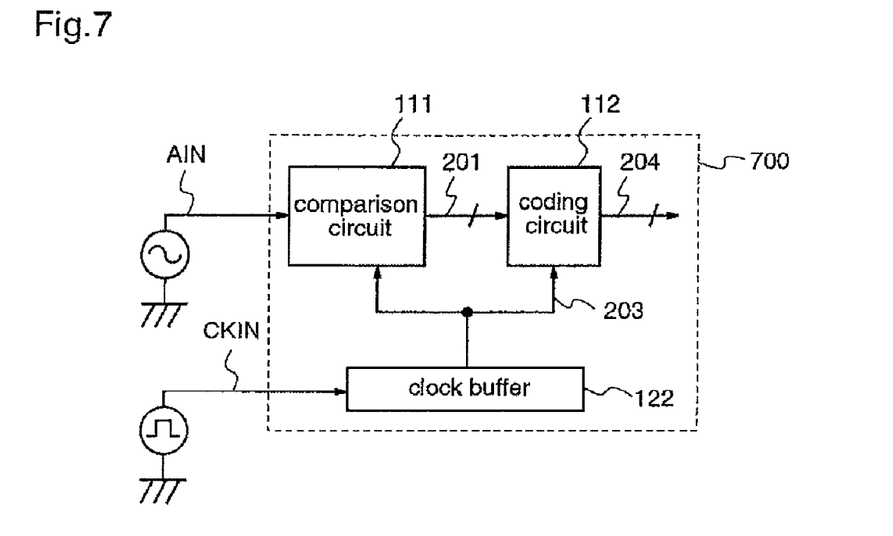
FIG. 7 is a configuration diagram of a conventional A/D converter.

FIG. 7 is a diagram illustrating a conventional parallel type A/D converter 700 (for example, shown in FIG. 1 of Patent Document 1), and the A/D converter 700 comprises a comparison circuit 111, a coding circuit 112, and a clock buffer 122.

The operation of the conventional parallel type A/D converter, which is described in [Embodiment 1] in Patent Document 1, is as follows.

That is, an external input clock signal CKIN is input to the clock buffer 122, and the clock buffer 122 supplies an internal clock 203 synchronized with the external input clock signal CKIN to the comparison circuit 111 and to the coding circuit 112.

Figure 8:
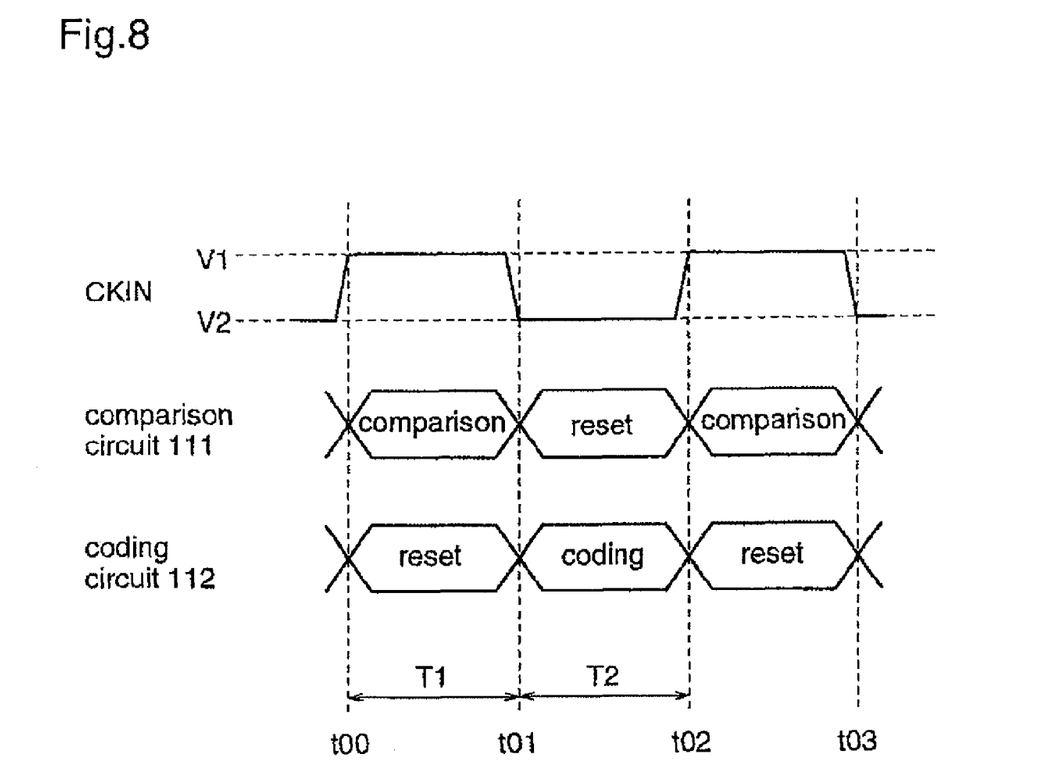
FIG. 8 is an operation timing chart of the conventional A/D converter.

FIG. 8 shows timing charts of the comparison circuit 111 and the coding circuit 112 which are operated upon receipt of the external clock signal CKIN.

The comparison circuit 111 performs a comparison operation and the coding circuit 112 performs a reset operation during a first period T1 when the external input clock signal CKIN is at a first predetermined level V1, and the comparison circuit 111 performs a reset operation and the coding circuit 112 performs a coding operation during a second period T2 when the external input clock signal CKIN is at a second predetermined level V2. Thus, the operation of the conventional A/D converter 700 depends on the duty ratio of the external input clock signal CKIN.

Patent Document 1: Japanese Published Patent Application No. 2003-158456

DISCLOSURE OF THE INVENTION

Problems to be Solved by the Invention

However, with an increase in the operating frequency which is required of the recent A/D converter, there may arise a case where sufficient operation periods of the comparison circuit 111 and the coding circuit 112 cannot be obtained because these operation periods depend on the duty ratio of the external input clock signal CKIN, and therefore, it is becoming difficult to maintain the conversion precision.

The present invention is made to solve the above-described problems and has for its object to provide an A/D converter which can secure the operation periods required for the comparison circuit and the coding circuit without depending on variations in the duty ratio of the external input clock, thereby to maintain high A/D conversion precision.

Measures to Solve the Problems

In order to solve the above-described problems, an A/D converter according to Claim 1 of the present invention comprises a comparison circuit which compares an analog input value with a predetermined value during a first period when a first clock is at a first predetermined level, and holds the comparison result during a second period when the first clock is at a second predetermined level; a coding circuit which is reset during the first period when the first clock is at the first predetermined level, and encodes the comparison result of the comparison circuit during the second period when the first clock is at the second predetermined level; an operation period detection circuit which is operated according to an external input clock, and outputs an operation period detection signal obtained by detecting the operation period of the A/D converter; and a synthesis circuit which receives the external input clock and the operation period detection signal outputted from the operation period detection circuit, and generates the first clock; wherein the first period when the first clock is at the first predetermined level is a period equal to or longer than the period when the external input clock is at the first predetermined level.

According to Claim 2 of the present invention, in the A/D converter defined in Claim 1, the operation period detection circuit includes a circuit having the same configuration as any of the circuits which configure the A/D converter.

According to Claim 3 of the present invention, in the A/D converter defined in Claim 2, the operation period detection circuit includes a circuit having the same configuration as the comparison circuit which configures the A/D converter.

According to Claim 4 of the present invention, in the A/D converter defined in Claim 2, the operation period detection circuit includes a circuit having the same configuration as the coding circuit which configures the A/D converter.

EFFECTS OF THE INVENTION

The A/D converter according to the present invention is provided with, in addition to the comparison circuit and the coding circuit, the operation period detection circuit which is operated according to an external input clock and outputs an operation period detection signal obtained by detecting the operation period of the A/D converter, and the synthesis circuit which receives the external input clock and the operation period detection signal outputted from the operation period detection circuit and generates the first clock. Therefore, the first clock which sufficiently secures the operation periods of the comparison circuit and the coding circuit, respectively, can be generated and outputted without depending on variations in the duty ratio of the external input clock, and thereby the A/D conversion precision can be maintained.

BRIEF DESCRIPTION OF THE DRAWINGS

FIG. 5(*a*) is a configuration diagram of an A/D converter 2000 according to a second embodiment of the present invention.

FIG. 5(*b*) is a configuration diagram of an operation period detection circuit 521 in the A/D converter 2000 of the second embodiment.

DESCRIPTION OF REFERENCE NUMERALS 1000, 2000 . . . A/D converter
111 . . . comparison circuit
112 . . . coding circuit
120 . . . synthesis circuit
121,521 . . . operation time detection circuit
122 . . . clock buffer
140 . . . first comparison circuit replica
141 . . . second comparison circuit replica
143 . . . frequency division circuit
144 . . . AND circuit
151 . . . delay circuit
152 . . . OR circuit
153 . . . selector
154 . . . NMOS transistor
160 . . . inverter
161 . . . coding circuit replica
162 . . . precharge transistor
163 . . . discharge transistor
201 . . . thermometer code signal
202 . . . operation period detection signal
203 . . . internal clock
204 . . . digital output signal
220, 221 . . . reference voltage
223 . . . power down signal
224 . . . reference voltage select signal
230, 231 . . . comparison result
AIN . . . analog input signal
CKIN . . . external input clock signal
CLK_DIV 1 . . . positive phase frequency division clock
CLK_DIV2 . . . inverted frequency division clock
VR1 to VRn−1 . . . resistance divided voltage

BEST MODE TO EXECUTE THE INVENTION

Embodiment 1

Figure 1:
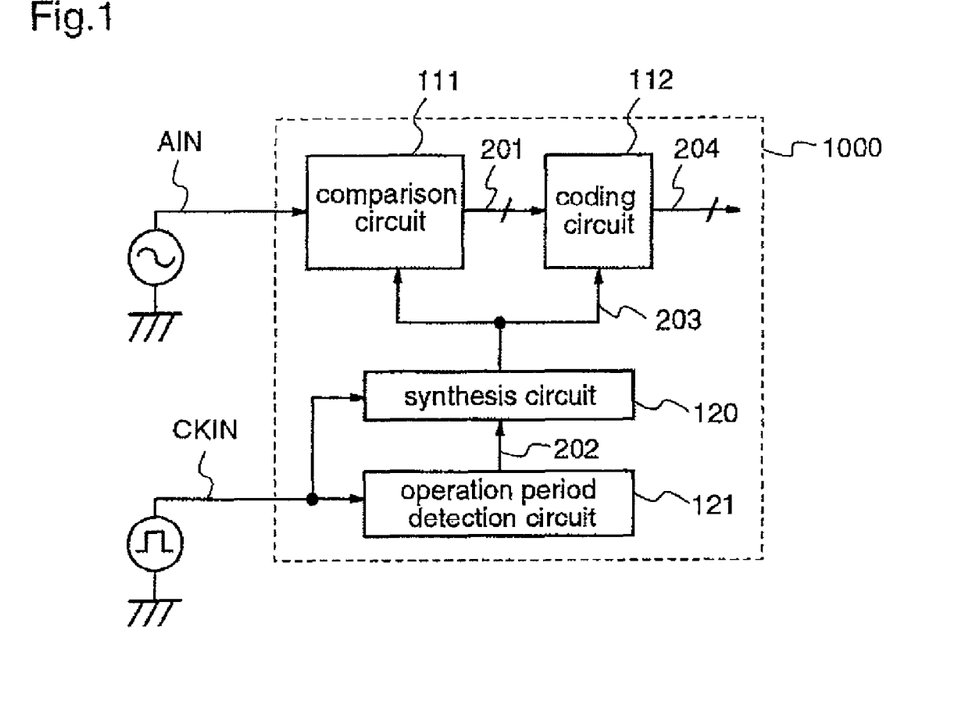
FIG. 1 is a configuration diagram of an A/D converter 1000 according to a first embodiment of the present invention.

FIG. 1 is a diagram illustrating a block configuration of an A/D converter 1000 according to a first embodiment of the present invention.

As shown in FIG. 1, the A/D converter 1000 of this first embodiment is configured comprising a comparison circuit 111 which compares an analog input signal with a predetermined value during a period when an internal clock 203 (first clock) is at a first predetermined level, and holds the comparison result during a period when the internal clock 203 is at a second predetermined level, a coding circuit 112 which is reset in the period when the internal clock 203 is at the first predetermined level, and encodes the comparison result during the period when the internal clock 203 is at the second predetermined level, an operation period detection circuit 121 which is operated according to an external input clock signal CKIN, and outputs an operation period detection signal 202 that is obtained by detecting the operation period of the A/D converter, and a synthesis circuit 120 which synthesizes the external input clock signal CKIN and the operation period detection circuit 202 outputted from the operation period detection circuit 121 to generate the internal clock 203, wherein the first clock 203 has the same cycle as the external input clock, and the period when the internal clock 203 is at the first predetermined level is longer than the period when the external input clock is at the first predetermined level.

As an example of configuration of the comparison circuit 111 according to this first embodiment, there is proposed a comparison circuit as described in FIG. 2 of Patent Document 1, which includes an input transistor unit to which a first output voltage set and a second output voltage among a plurality of output voltage sets are inputted, and a positive feedback unit which is operated according to a clock signal.

Figure 2:
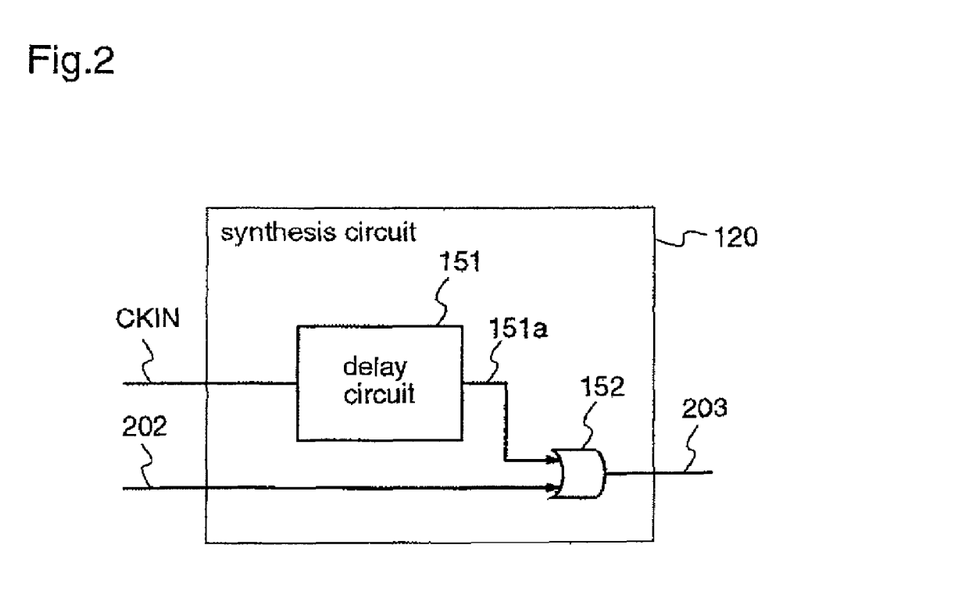
FIG. 2 is a configuration diagram illustrating a synthesis circuit 120 of the first embodiment.

FIG. 2 is a diagram illustrating a configuration example of the synthesis circuit 120 in the A/D converter 1000 of the first embodiment.

As shown in FIG. 2, the synthesis circuit 120 is configured comprising a delay circuit 151 which receives the external input clock signal CKIN and outputs a delay clock 151a, and an OR circuit 152 which receives, as two inputs, the operation period detection signal 202 outputted from the operation period detection circuit 121 and the delay clock 151a outputted from the delay circuit 151 and outputs the internal clock 203.

Figure 3:
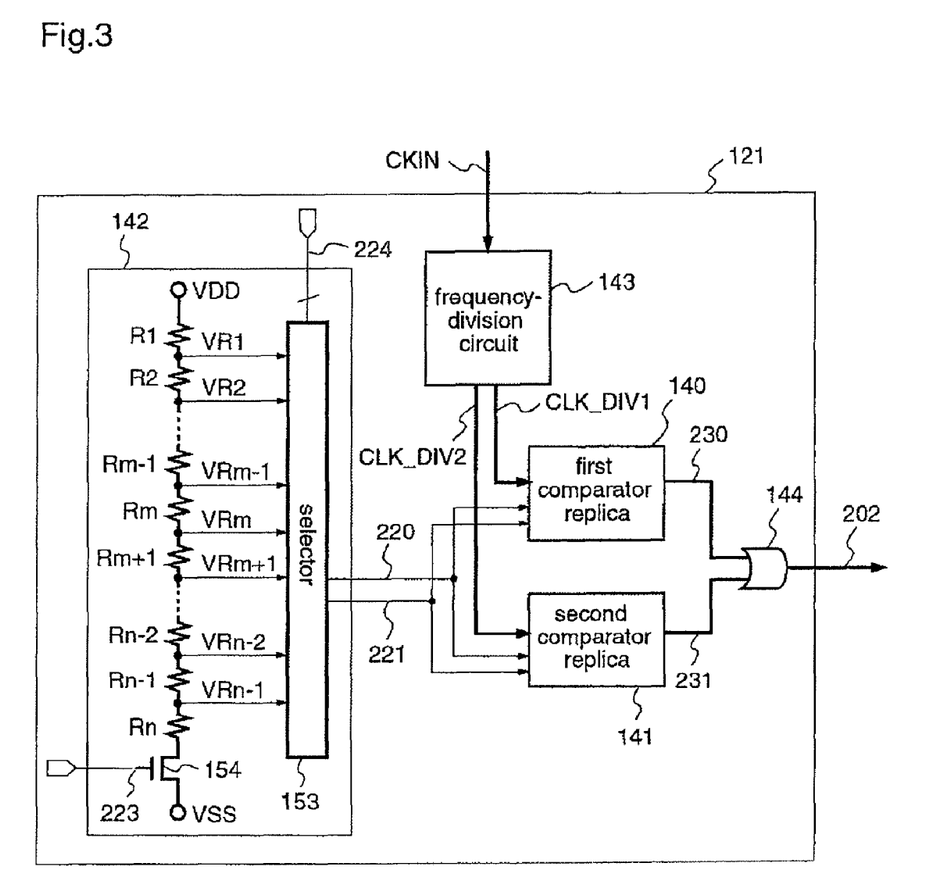
FIG. 3 is a configuration diagram of an operation period detection circuit 121 in the A/D converter 1000 of the first embodiment.

FIG. 3 is a diagram illustrating the configuration of the operation period detection circuit 121 in the A/D converter 1000 of this first embodiment.

In FIG. 3, the operation period detection circuit 121 of the first embodiment is configured having first and second comparison circuit replicas 140 and 141 of the same configuration as the comparison circuit 111, a reference voltage generation circuit 142 for generating input voltages to the first and second comparison circuit replicas 140 and 141, and a frequency division circuit 143 for generating operation clocks to be input to the first and second comparison circuit replicas 140 and 141, and an AND circuit 144 which receives the outputs from the first and second comparison circuit replicas 140 and 141.

The operation clocks for the first and second comparison circuit replicas 140 and 141 of the same configuration as the comparison circuit 111 must be longer than twice the external input clock CKIN because there are cases where the comparison operations of the first and second comparison circuit replicas 140 and 141 require longer periods than the comparison period determined by the external input clock CKIN. Therefore, the frequency division circuit 143 receives the external input clock CKIN as an input, and outputs a positive phase frequency division clock CLK_DIV1 having a period longer than twice the external input clock CKIN, and an inverted frequency division clock CLK_DIV2 which is an inversion signal of the positive phase frequency division clock CLK_DIV1.

The reference voltage generation circuit 142 is configured by unit resistors R1 to Rn, a NMOS transistor 154 for power down, and a selector 153. A series circuit comprising the unit resistors R1 to Rn and the NMOS transistor 154 for power down outputs division voltages VR1 to VRn−1 which are desirably weighted, and the selector 153 selects two values from among the division voltages VR1 to VRn−1, thereby to generate reference voltages 220 and 221.

The first and second comparison circuit replicas 140 and 141 receive, as input clocks, the positive phase frequency division clock CLK_DIV1 which is a clock obtained by frequency-dividing the external input clock CKIN, and the inverted frequency division clock CLK_DIV2 as an inversion signal of the CLK_DIV1, respectively, and receive, as inputs, the reference voltages 220 and 221 outputted from the reference voltage generation circuit 142, and output comparison results 230 and 231 which are obtained by comparing the two inputs, respectively.

The comparison results 230 and 231 are input to the AND circuit 144, and the AND circuit 144 outputs an operation period detection signal 202 which is a signal obtained by detecting the operation period of the comparison circuit in the A/D converter 1000.

Figure 4:
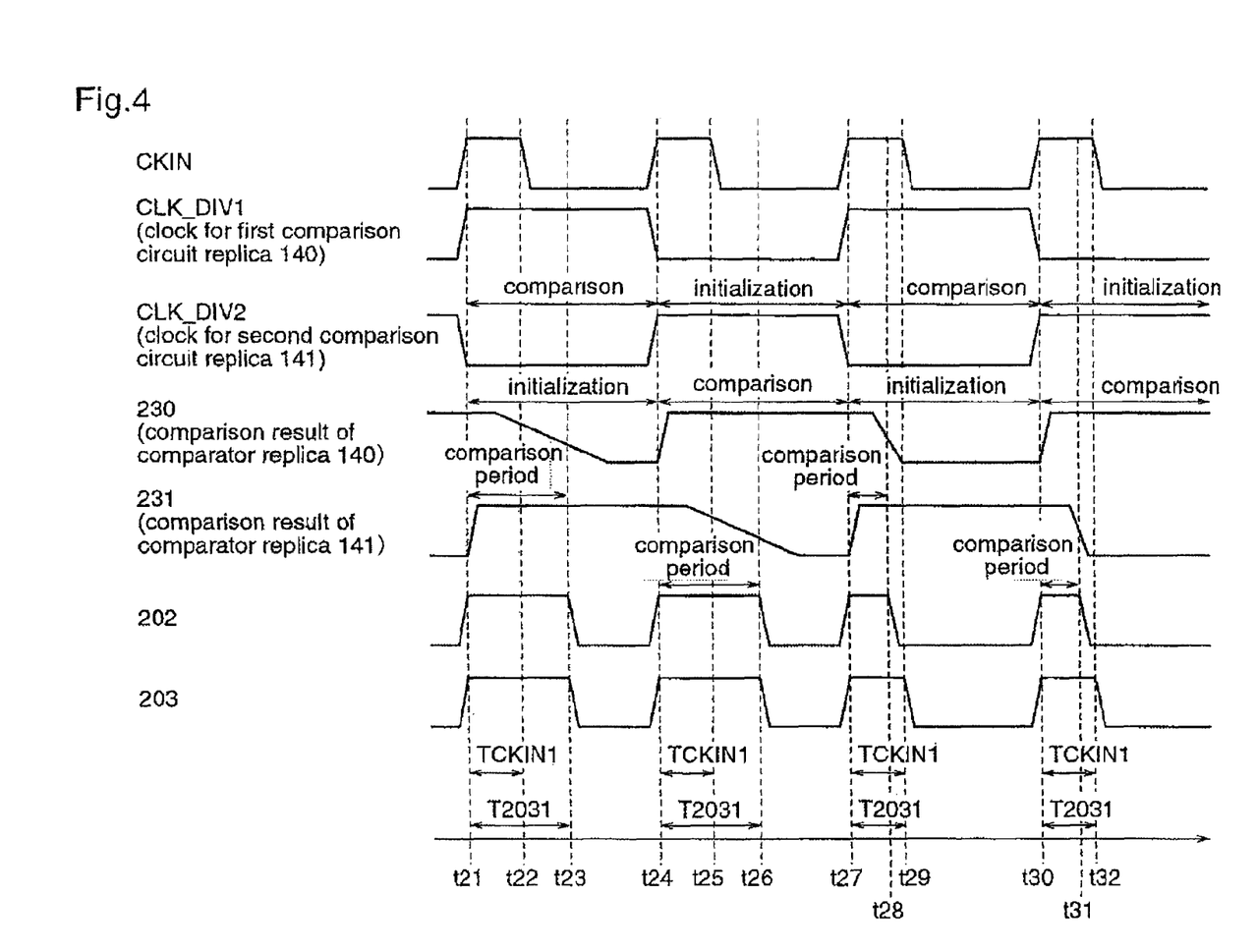
FIG. 4 is an operation timing chart of the A/D converter 1000 of the first embodiment.

FIG. 4 shows the operation timing charts of the operation period detection circuit 121 and the synthesis circuit 120 in the A/D converter 1000 of the first embodiment.

As shown in FIG. 4, the first comparison circuit replica 140 starts the comparison operation at the rising edges t21 and t27 of the positive-phase frequency-division clock CLK_DIV1, and terminates the comparison operation at times t23 and t28 when the comparison result 230 transits to "L" level. Similarly, the second comparison circuit replica 141 starts the comparison operation at the rising edges t24 and t30 of the inverted frequency division clock CLK_DIV2, and terminates the comparison operation at times t26 and t31 when the comparison result 231 transits to "L" level.

The AND circuit 144 in the operation period detection circuit 121 receives the comparison result 230 of the first comparison circuit replica 140 and the comparison result 231 of the second comparison circuit replica 141, and outputs the operation period detection signal 202 which is "H" level in the period t21 to t23, the period t27 to t28, the period t24 to t26, and the period t30 to t31 because the comparison result 230 is "H" level in the period t21 to t23, the period t24 to t28, and the period t30 to t32 while the comparison result 231 is "H" level in the period t21 to t26 and the period t27 to t31.

Further, the OR circuit 152 in the synthesis circuit 120 receives the delay clock 151a of the external input clock CKIN and the operation period detection signal 202, and outputs the internal clock 203 which is "H" level in the period t21 to t23, the period t27 to t29, the period t24 to t26, and the period t30 to t32 because the external input clock CKIN is "H" level in the period t21 to t22, the period t24 to t25, the period t27 to t29, and the period t30 to t32 while the operation period detection signal 202 is "H" level in the period t21 to t23, the period t27 to t28, the period t24 to t26, and the period t30 to t31. FIG. 4 shows the case where the delay in the synthesis circuit 120 due to the delay circuit 151 is approximately zero.

As described above, in the period t21 to t23 and the period t24 to t26, the period t2031 when the internal clock 203 is H level is longer than the period TCKIN1 when the external input clock CKIN is H level, and it is equal to the comparison periods indicated by the comparison results 203 and 231 of the first and second comparison circuit replicas 140 and 141. Further, in the period t27 to t29 and the period t30 to t32, the period t2031 when the internal clock 203 is H level is longer than the comparison periods indicated by the comparison results 230 and 231 of the first and second comparison circuit replicas 140 and 141. Accordingly, even when the predetermined period of the external input clock CKIN is shorter than the comparison period as in the period t21 to t23 or the period t24 to t26, the comparison operation time of the comparison circuit can be secured by using the internal clock 203.

As described above, the A/D converter 1000 of this first embodiment includes the comparison circuit 111 which compares an analog input signal with a predetermined value during a period when the first clock (internal clock) 203 is at the first predetermined level and holds the comparison result during a period when the first clock 203 is at the second predetermined level, the coding circuit 112 which is reset during the period when the first clock 203 is at the first predetermined level and encodes the comparison result during the period when the first clock 203 is at the second predetermined level, the operation period detection circuit 121 which includes the comparison circuit replicas 140 and 141 of the same construction as the comparison circuit 111, is operated according to the external input clock, and outputs an operation period detection signal 202 obtained by detecting the operation period of the comparison circuit 111 in the A/D converter 1000, and the synthesis circuit 120 which receives the external input clock and the operation period detection signal 202 outputted from the operation period detection circuit 121, and generates the first clock 203, wherein the first clock 203 has the same cycle as the external input clock, and the period when the first clock is at the first predetermined level is equal to or longer than the period when the external input clock is at the first predetermined level. Therefore, the first clock 203 inputted to the comparison circuit 111 has the same cycle as the external input clock, and the comparison period of the first clock 203 is equal to or longer than the comparison operation period of the comparison circuit 111, and thereby the A/D conversion precision of the A/D converter can be maintained without depending on variations in the duty ratio of the external input clock signal CKIN.

Embodiment 2

Hereinafter, an A/D converter 2000 according to a second embodiment of the present invention will be described with reference to the drawings.

Figure 5A:
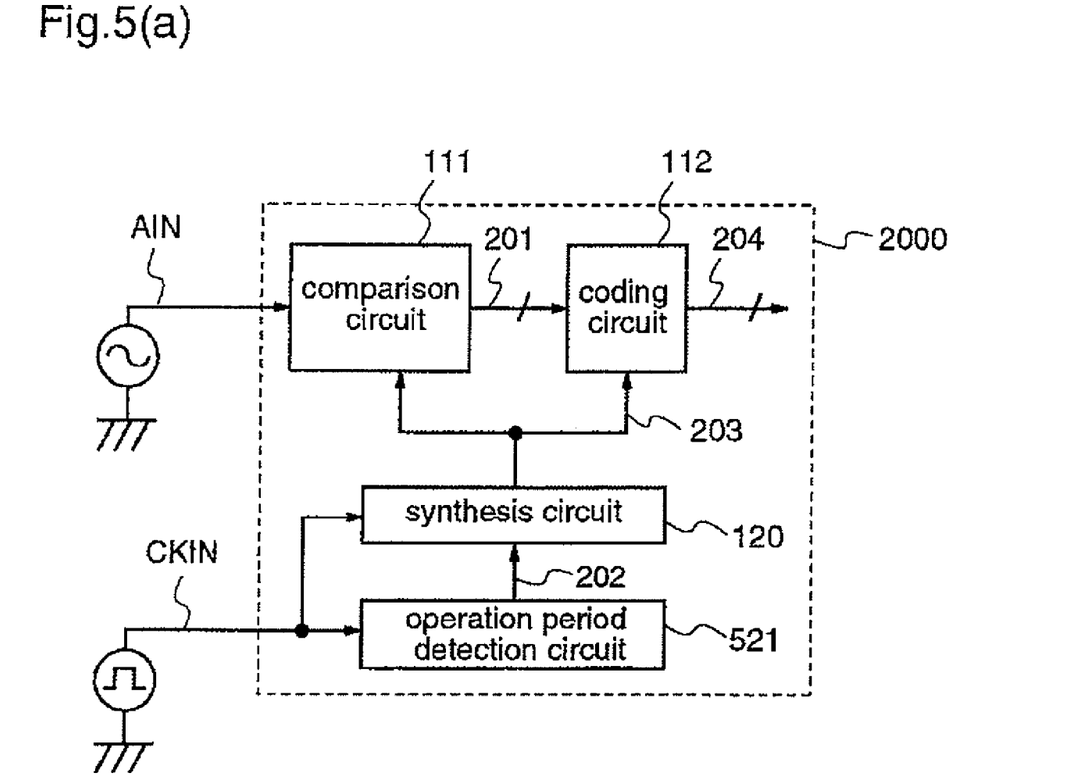
Figure 5B:
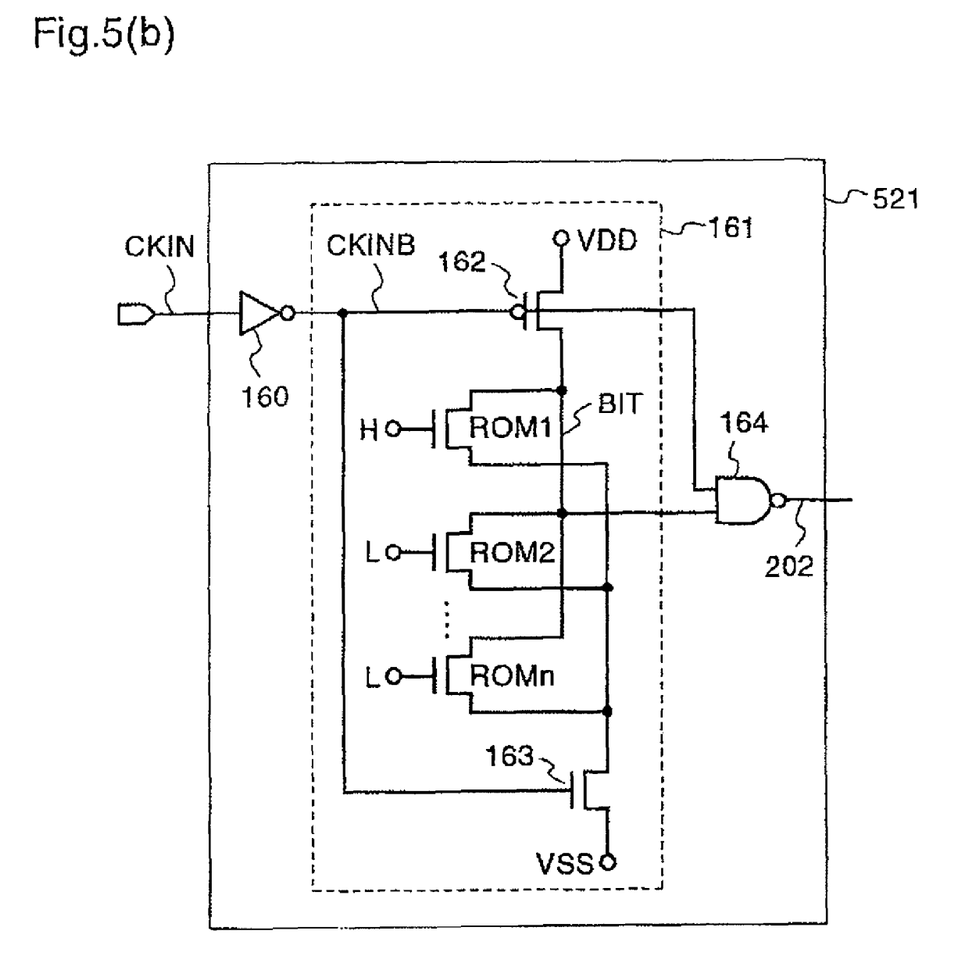

FIG. 5(a) shows the A/D converter 2000 of this second embodiment, and FIG. 5(b) shows an operation period detection circuit 521 in the A/D converter 2000.

The A/D converter 2000 of this second embodiment shown in FIG. 5(a) has the operation period detection circuit 521 shown in FIG. 5(b) as an operation period detection circuit used in the A/D converter.

More specifically, the operation period detection circuit 521 includes an inverter 160, and a coding circuit replica 161 which is of the same configuration as the coding circuit 112 in the A/D converter 2000 of this second embodiment, and the coding circuit replica 161 comprises a precharge transistor 162 for charging electric charges, ROM transistors ROM1 to ROMn, and a discharge transistor 163 for discharging electric charges.

The coding circuit replica 161 has, as an operation clock, an inverted external input clock signal CKINB which is an inversion signal of an external input clock signal CKIN, and the coding circuit replica 161 is in its initial state when the inverted external input clock signal CKINB is "L" level. At this time, the precharge transistor 162 is turned on while the discharge transistor 163 is turned off, and a bit line BIT becomes "H" level.

Further, when the inverted external input clock signal CKINB is "H" level, the coding circuit replica 161 is in its coding period, and the precharge transistor 162 is turned off while the discharge transistor 163 is turned on, and the electric charges in the bit line BIT are discharged by setting the gain input of any of the ROM transistors ROM1 to ROMn to "H" level (in FIG. 5, the gate input of the ROM transistor ROM1 is set to "H" level) during the coding period, and thus the bit line BIT becomes "L" level by setting the gate voltage of any of the ROM transistors 1 to n to "H" level.

The bit line BIT and the inverted external input clock signal CKINB are input to the NOR circuit 164, and the NOR circuit 164 outputs an operation period detection signal 202 which is a signal obtained by detecting the operation period of the coding circuit in the A/D converter 2000.

Figure 6:
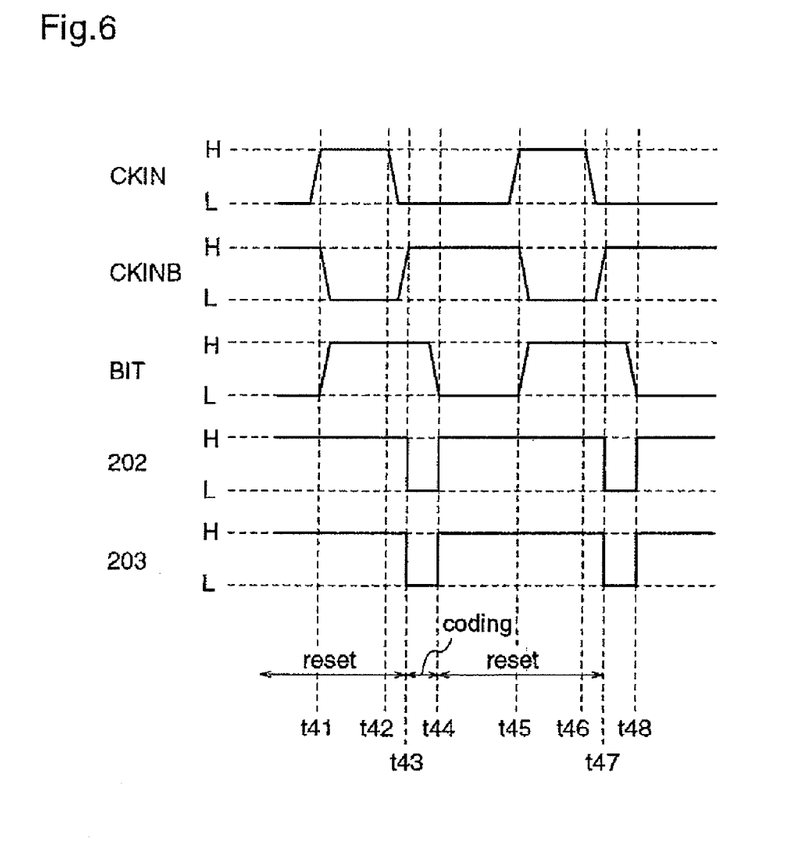
FIG. 6 is an operation timing chart of the A/D converter 2000 of the second embodiment.

FIG. 6 shows the operation timing charts of the operation period detection circuit 521 and the synthesis circuit 120 in the A/D converter 2000 of this second embodiment.

Next, the operation of the A/D converter 2000 of the second embodiment will be described with reference to FIG. 6.

At the falling times t41 and t45 of the inverted external input clock signal CKINB, the precharge transistor 162 transits from OFF to ON and the discharge transistor 163 transits from ON to OFF, and thereby the bit line BIT is changed to "H" level (reset).

At the rising times t43 and t47 of the inverted external input clock signal CKINB, the precharge transistor 162 transits from ON to OFF and the discharge transistor 163 transits from OFF to ON. At this time, since the gate input of any of the ROM transistors ROM1 to ROMn is "H" level (ON state), the bit line BIT is changed from "H" level to "L" level (encoded) at the times t44 and t48.

The internal clock 203 and the operation period detection signal 202 having the period t44 to t47 as the reset period of the coding circuit and the period t47 to t48 as the coding period of the coding circuit are outputted due to the changes in the inverted external input clock signal CKINB and the bit line BIT.

More specifically, the NOR circuit 164 in the operation period detection circuit 521 receives the inverted external input clock signal CKINB and the bit line BIT, and outputs the operation period detection signal 202 which is "H" level in the period t44 to t47 and "L" level in the period t43 to t44 and the period t47 to t48 since the inverted external input clock signal CKINB is "H" level in the period t43 to t45 and the period t47 to t48 and the bit line BIT is "H" level in the period t41 to t44 and the period t45 to t48.

Further, the OR circuit 152 in the synthesis circuit 120 receives the delay clock 151a of the external input clock signal CKIN and the operation period detection signal 202, and outputs the internal clock 203 which is "H" level in the period t44 to t47 and "L" level in the period t43 to t44 and the period t47 to t48 since the external input clock signal CKIN is "H" level in the period t41 to t42 and the period t45 to t46 while the operation period detection signal 202 is "H" level in the period t44 to t47. FIG. 6 shows the case where the delay of the synthesis circuit 120 due to the delay circuit 151 is approximately zero.

As described above, the period t44 to t47 when the internal clock 203 is H level is longer than the period t45 to t46 when the external input clock CKIN is H level, and the H level period of the internal clock 203 and the reset period of the coding circuit are both the period t44 to t47, i.e., equal to each other. While the coding operation time of the coding circuit is shorter than the coding time determined by the external input clock CKIN, there are cases where the comparison operation time of the comparison circuit is required to be longer than the comparison time determined by the external input clock CKIN. Since the comparison period of the comparison circuit is equal to the reset period of the coding circuit as in the case shown in FIG. 8, the H level period of the internal clock 203 is equal to or longer than the reset operation period of the coding circuit in this second embodiment, and thereby the comparison operation time of the comparison circuit can be secured.

According to the second embodiment, the A/D converter 2000 comprises the comparison circuit 111 which compares the analog input signal with a predetermined value during the period when the first clock (internal clock) 203 is at the first predetermined level and holds the comparison result during the period when the first clock 203 is at the second predetermined level, the coding circuit 112 which is reset during the period when the first clock 203 is at the first predetermined level and encodes the comparison result during the period when the first clock 203 is at the second predetermined level, the operation period detection circuit 521 which includes the coding circuit replica 161 of the same construction as the coding circuit 112, operates according to the external input clock, and outputs an operation period detection signal 202 obtained by detecting the operation period of the A/D converter 2000, and the synthesis circuit 120 which receives the external input clock and the operation period detection signal 202 which are outputted from the operation period detection circuit 521, and generates the first clock 203, wherein the period when the first clock is at the first predetermined level is equal to or longer than the period when the external input clock is at the first predetermined level. Therefore, the comparison period of the comparison circuit 111 is always equal to the reset period of the coding circuit 112, and thereby the comparison period of the internal clock 203 inputted to the comparison circuit 111 is equal to or longer than the reset period of the coding circuit 112, i.e., the comparison operation time of the comparator configuring the comparison circuit 111, and thus the A/D conversion precision of the A/D converter can be maintained without depending on variations in the duty ratio of the external input clock signal CKIN.

APPLICABILITY IN INDUSTRY

The A/D converter according to the present invention can maintain the A/D conversion precision without depending on the external conditions such as the temperature, process, and power supply voltage, and variations in the duty ratio of the external input clock, and therefore, it is useful as an A/D converter used in electronic devices and electronic circuits.

The invention claimed is:

1. An A/D converter comprising:
a comparison circuit which compares an analog input value with a predetermined value during a first period when a first clock is at a first predetermined level, and holds the comparison result during a second period when the first clock is at a second predetermined level;
a coding circuit which is reset during the first period when the first clock is at the first predetermined level, and encodes the comparison result of the comparison circuit during the second period when the first clock is at the second predetermined level;
an operation period detection circuit which is operated according to an external input clock, and outputs an operation period detection signal obtained by detecting the operation period of the A/D converter; and
a synthesis circuit which receives the external input clock and the operation period detection signal outputted from the operation period detection circuit, and generates the first clock;
wherein the first period when the first clock is at the first predetermined level is a period equal to or longer than the period when the external input clock is at the first predetermined level.

2. An A/D converter as defined in claim 1 wherein said operation period detection circuit includes a circuit having the same configuration as any of the circuits which configure the A/D converter.

3. An A/D converter as defined in claim 2 wherein said operation period detection circuit includes a circuit having the same configuration as the comparison circuit which configures the A/D converter.

4. An A/D converter as defined in claim 2 wherein said operation period detection circuit includes a circuit having the same configuration as the coding circuit which configures the A/D converter.

* * * * *